US005682103A

United States Patent [19]

Burrell

[11] Patent Number: 5,682,103

[45] Date of Patent: Oct. 28, 1997

[54] INFRARED DETECTION OF AUTHENTICITY OF SECURITY DOCUMENTS COMPRISING ELECTROMAGNETIC PARTICLES

[75] Inventor: Jonathan Burrell, Bourn Cambridge, United Kingdom

[73] Assignee: N.V. Bekaert S.A., Zwevegem, Belgium

[21] Appl. No.: 646,147

[22] Filed: May 7, 1996

[30] Foreign Application Priority Data

May 24, 1995 [EP] European Pat. Off. .............. 95201360

[51] Int. Cl.[6] .......................... G01R 27/04; G01N 21/17

[52] U.S. Cl. .......................... 324/642; 324/644; 250/556; 356/71; 283/70

[58] Field of Search ...................................... 324/637, 642, 324/644, 646; 194/206, 207; 209/534, 576, 577; 250/556; 283/70; 356/71; 380/23

[56] References Cited

U.S. PATENT DOCUMENTS

| | | | |
|---|---|---|---|
| 4,127,328 | 11/1978 | Gorgone et al. | 356/71 |
| 4,763,927 | 8/1988 | Schneider | 283/70 |
| 4,820,912 | 4/1989 | Samyn | 324/637 X |
| 5,279,403 | 1/1994 | Harbaugh et al. | 194/207 |
| 5,308,992 | 5/1994 | Crane et al. | 250/556 |
| 5,418,855 | 5/1995 | Liang et al. | 380/23 |
| 5,434,427 | 7/1995 | Crane et al. | 250/556 |
| 5,498,879 | 3/1996 | De Man | 250/556 |

FOREIGN PATENT DOCUMENTS

| | | |
|---|---|---|
| 0 092 691 | 11/1983 | European Pat. Off. . |
| 0 204 574 | 12/1986 | European Pat. Off. . |
| 0 537 513 | 4/1993 | European Pat. Off. . |
| WO 87/01845 | 3/1987 | WIPO . |

*Primary Examiner*—Vinh P. Nguyen
*Assistant Examiner*—Diep Do
*Attorney, Agent, or Firm*—Foley & Lardner

[57] ABSTRACT

An apparatus for checking the authenticity of a security document (28). The security document (28) comprises a base material and in its volume particles having some electromagnetic properties which are substantially different from the corresponding electromagnetic properties of the base material. The apparatus comprises at least one emitter (18) for emitting near infrared or visible waves to the document (28), at least one detector (20) for detecting any of the emitted near infrared or visible waves reflected from the document (28) and means (30) for processing the detected near infrared or visible waves in order to differentiate the security document (28) from a document comprising electromagnetic particles or parts on its surface.

17 Claims, 3 Drawing Sheets

INFRARED DETECTION OF AUTHENTICITY OF SECURITY DOCUMENTS COMPRISING ELECTROMAGNETIC PARTICLES

FIELD OF THE INVENTION

The invention relates to a detection apparatus and a method for checking the authenticity of a security document which comprises a base material and particles having some electromagnetic properties which are substantially different than the corresponding electromagnetic properties of the base material.

The invention also relates to a reproduction apparatus such as a photocopying machine or scanning apparatus which comprises such a detection apparatus. The invention also relates to an automatic document counting machine and to an automatic vending machine which comprises such an apparatus.

BACKGROUND OF THE INVENTION

The terms 'security document' refer to every kind of document of some value the illicit reproduction of which should be prohibited. The terms 'security document' refer to a banknote, a share, a cheque, a passport, a bond, a credit card, . . .

The terms 'particles having some electromagnetic properties which are substantially different from the corresponding electromagnetic properties of the base material' refer to any small-sized materials which can be incorporated in the base material of a security document and which have a dielectric constant $\epsilon$, a magnetic permeability $\mu$, or an electric resistivity $\rho$ differing substantially from the $\epsilon$, $\mu$, or $\rho$ of the base material. A proper example of such particles are electrically conductive stainless steel fibres being incorporated in a base material of paper or plastic.

The presence of such particles may easily be detected by means of microwaves. If a particular kind of security document comprises such stainless steel fibres, detection of such fibres indicates the authenticity of such documents and one or another proper action will follow: acceptance of the document or refusal to copy the document or some other action.

A remaining problem with the present system is that there is a possibility of misrecognition between security documents comprising e.g. stainless steel fibres in their volume and another kind of documents or of objects, the surface of which is partially covered with metal foil or parts of a thin metal film: a first example is formed by some kind of greeting cards having on their surface as a decorative element some metal foil; a second example is formed by the printed circuit boards (or PCB's) where the electrical conductors are formed by thin lines of one or another conducting metal alloy; a third example is formed by fabrics woven with metal. This kind of objects or documents may result in a microwave response signal which is rather similar to a microwave response signal resulting from a security document with stainless steel fibres so that misrecognition is likely to occur.

SUMMARY OF THE INVENTION

The present invention aims at avoiding the drawbacks of the prior art.

According to the present invention, there is provided an apparatus and a method for checking the authenticity of a security document or of security documents.

The security document comprises a base material and particles having some electromagnetic properties in its volume which are substantially different from the corresponding electromagnetic properties of the base material.

The apparatus comprises at least one emitter for emitting near infrared or visible waves to said document, at least one detector for detecting any of the emitted near infrared or visible waves reflected from the document, means for processing said detected near infrared or visible waves in order to differentiate a document comprising electromagnetic particles or parts on its surface from authentic security documents comprising electromagnetic particles in its volume.

The term 'reflected' refers not only to waves reflected in the same direction but also includes waves scattered back in a number of directions.

The terms 'near infrared or visible waves' refer to waves having a wave length $\lambda$ ranging from about $4.10^{-4}$ mm to about $2.10^{-3}$ mm. The term 'near infrared waves' excludes the thermal infrared waves the wave length of which ranges from about $2.10^{-3}$ mm to $15.10^{-3}$ mm..

Preferably the near infrared or visible waves are near infrared waves and the corresponding emitter is an infrared emitter and the corresponding detector is an infrared detector. Infrared emitters and infrared detectors are commonly available in the art.

The principle of operation is simple. Authentic security documents having only in their volume—and not on their surface—electromagnetic particles, result in a relatively flat and low infrared response signal.

For example, the inks of banknotes are not very reflective in the near infrared or visible range. The reflection from other documents or objects with on their surface electromagnetic particles or parts such as metal foils tends to be high and spiky in places, which is a response signal that differs substantially from the signal of authentic security documents and that is suitable to permit differentiation between an authentic security document and a document with electromagnetic particles or parts on its surface.

Although the object of the present invention can be reached with an apparatus that comprises only means for emitting and receiving near infrared waves, an embodiment of the apparatus according to the invention may further comprise at least one microwave emitter for emitting microwaves to the document and at least one microwave detector for detecting any of the emitted microwaves reflected from the document and means for comparing the detected microwaves with the detected near infrared or visible waves. The principle of operation of this embodiment is straightforward. For objects or documents the surface of which has been covered with metal foil, a metal film, golden wires or other metal elements, both the infrared detector and the microwave detector 'sees' the metal and the correlation between the received microwave signal and the received infrared signal is high. In contrast herewith, authentic security documents having stainless steel fibres incorporated in the base material, result in a particular microwave response while no particular infrared response is created so resulting in a rather low correlation between the infrared signal and the microwave signal.

The apparatus and the method according to the invention can be used in a plurality of applications such as in a reproduction apparatus where at least accurate reproduction of a security document should be prevented.

As a matter of example, a photocopying apparatus may comprise a detection apparatus according to the invention. As soon as the presence of a security document is detected, the photocopying apparatus refuses to copy accurately the security document by changing the size of the copy, by changing the color of the copy, by printing a mark on the copy, or simply by refusing to copy at all. As a matter of a second example, the detection apparatus according to the invention can be used in an automatic document counting apparatus. The counting apparatus can be so tuned that only authentic security documents comprising stainless steel fibres are counted. Cheating the counting apparatus by inserting a foil card is no longer possible.

As a matter of a third example, the detection apparatus according to the invention can be used in an automatic vending apparatus. The automatic vending apparatus is so tuned that only banknotes comprising stainless steel fibres are accepted as means for paying and that other documents are rejected.

BRIEF DESCRIPTION OF THE DRAWINGS

The invention will now be described in more detail with reference to the accompanying drawings wherein FIG. 1 gives a schematic view of a first embodiment of an apparatus according to the invention.

DESCRIPTION OF THE PREFERRED EMBODIMENTS OF THE INVENTION

Figure 1:
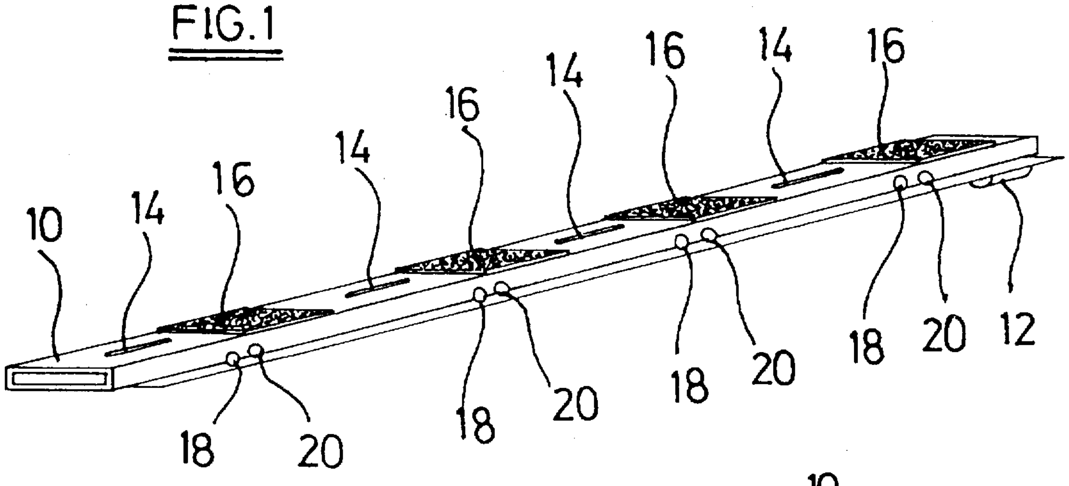

FIG. 1 shows a hollow, rectangular brass wave guide 10. A Gunn diode 12 or a transistor oscillator working at 24 GHz functions as a microwave source. Four elongated slots 14 are formed in one of the sides of the wave guide 10 and function as microwave emitters. Adjacent to each slot 14 is a printed circuit board PCB 16 which comprises an antenna (not shown) for receiving any reflected microwaves and a detection module for further processing the received microwave signal. One microwave slot 14 and one PCB 16 form a microwave sensor 14–16. An infrared light emitting diode (LED) 18 and a photodiode 20 are positioned at the location of each PCB 16. The infrared LED 18 emits infrared waves to the documents and the photodiode 20 receives any reflected infrared waves. One infrared LED 18 and one photodiode 20 form an infrared sensor 18–20. Due to the fact that the infrared sensors 18–20 are not positioned at the same level as the microwave sensors 14–16, the infrared signal or the microwave signal must be subjected to a small shift in order to obtain a correct correlation. Preferably the apparatus according to the invention has an infrared filter positioned between the infrared sensor and the microwave sensor, on the one hand, and the document, on the other hand.

Such an infrared filter results in more representative infrared signals and allows transmission of microwaves.

Figure 2:
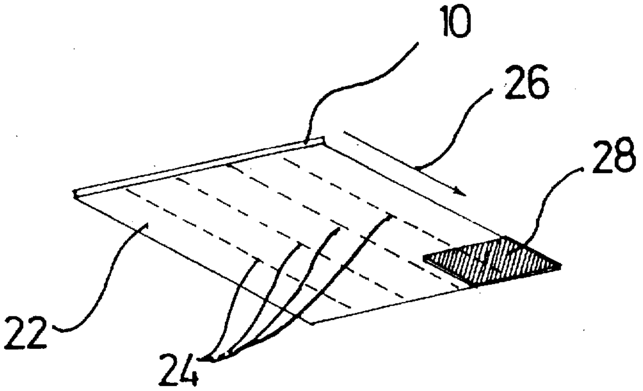
FIG. 2 illustrates how a first embodiment of an apparatus according to the invention operates in a photocopying machine.

FIG. 2 illustrates the operation of the apparatus in a photocopying apparatus. The wave guide 10 together with its microwave sensors 14–16 and its infrared sensors 18–20 are positioned under the glass platen 22 of a photocopying apparatus. At the location of each microwave sensor 14–16 and each infrared sensor 18–20 a scanning trace 24 is formed when the wave guide 10 is moved in direction of arrow 26. On condition that security documents comprise over their complete volume stainless steel fibres and that their minimum dimension is at least 65 mm (which is the case for the majority of banknotes) and if the copying area formed by glass platen 22 is equal to the surface of a DIN A4 page, at least four pairs of microwave-infrared sensors are needed to scan the whole area and to detect any possible security document 28 lying on platen 22, irrespective of its position. For more information about the working of a detection apparatus comprising an array of microwave sensors in a photocopying apparatus, reference is made to applicant's international application PCT/EP95/00668 filed on 23 Feb. 1995.

Figure 3:
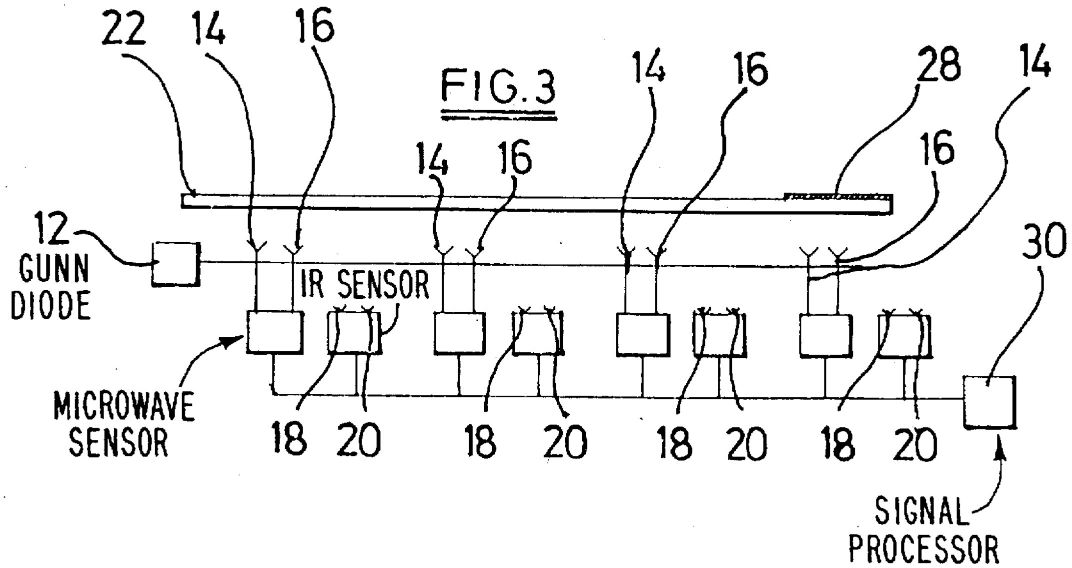
FIG. 3 illustrates the signal flow in a first embodiment of an apparatus according to the invention.

FIG. 3 illustrates schematically the signal flow in a detection apparatus according to the present invention. Any microwaves received by PCB 16 and any infrared waves received by photodiode 20 can be processed in the same way and can be led to a signal processor 30. This signal processor 30 determines whether or not there is a high correlation between the microwave signal and the infrared signal.

Figure 4:
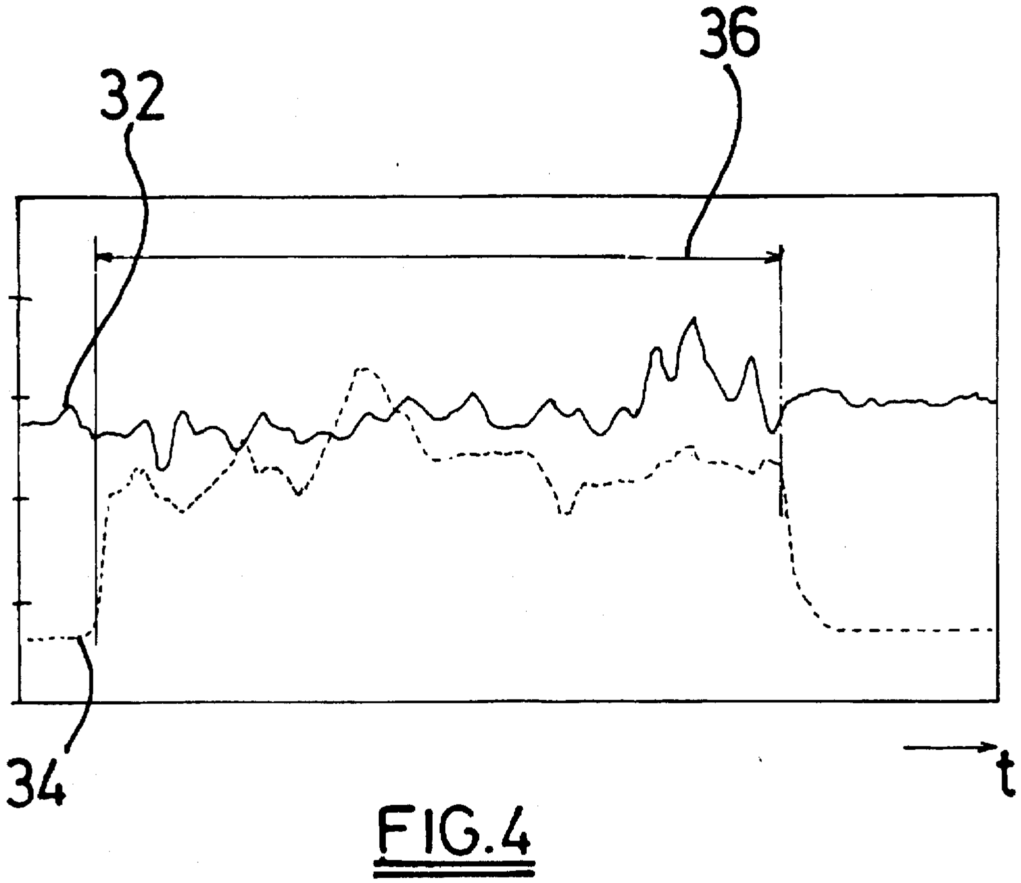
FIG. 4 gives an example of a microwave and an infrared signal received from an authentic security document.

FIG. 4 illustrates typical signals received from an authentic bank note 28 comprising stainless steel fibres. The received microwave signal is depicted in a full line 32, while the infrared signal is shown in dashed lines 34. The bank note is positioned over an interval 36. During interval 36 the microwave signal 32 shows a highly varying signal whereas the infrared signal 34 shows no particular high variations. Correlation of both microwave signal 32 and infrared signal 34 over the whole scanned interval is rather low, i.e. below an empirically determined threshold value. The high variation level of the microwave signal 32 points towards the presence of electromagnetic particles on or in the document. The low variation level of the infrared signal 34, however, indicates that the scanned document or object has no electromagnetic particles on its surface. This means that the electromagnetic particles must be in the document itself, which means that the document is an authentic security document.

Figure 5:
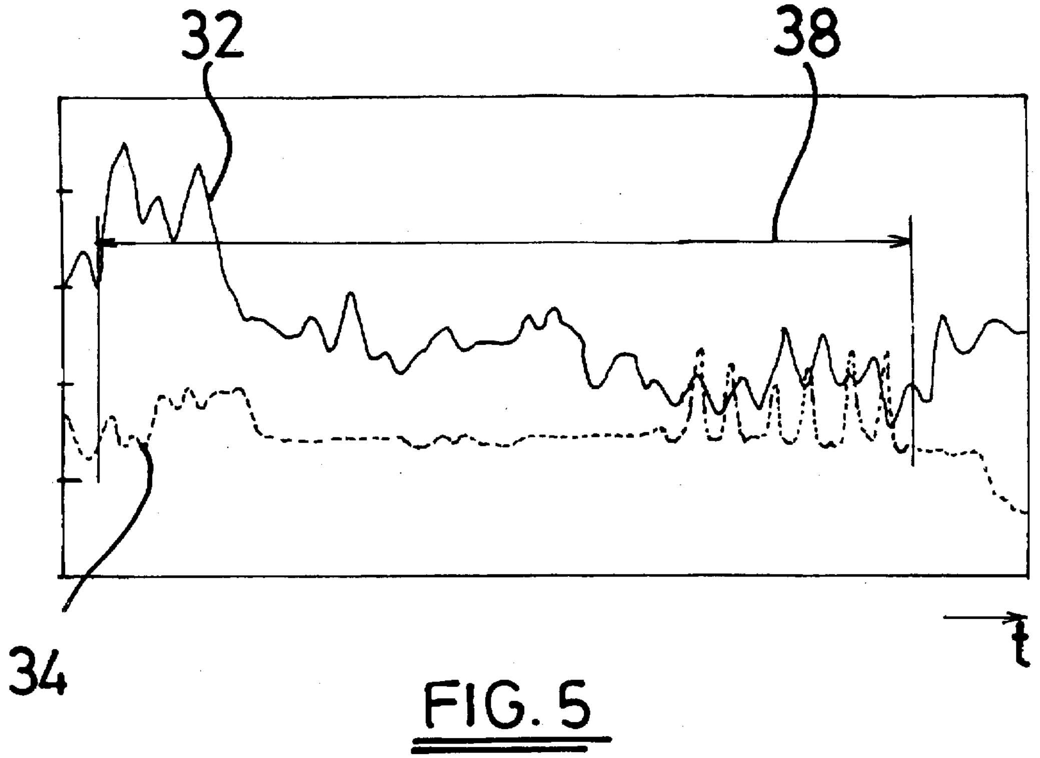
FIG. 5 gives an example of a microwave and an infrared signal received from a PCB.

FIG. 5 illustrates typical signals received from a PCB. The received microwave signal is depicted in a full line 32, while the infrared signal is shown in dashed lines 34. The PCB is positioned over an interval 38. During interval 38 both the microwave signal 32 and the infrared signal 34 show highly varying signals. Correlation of both microwave signal 32 and infrared signal 34 over the whole scanned interval is rather high, i.e. above a determined threshold value. The high variation level of the microwave signal points towards the presence of electromagnetic particles on or in the scanned object.

The high variation level of the infrared signal 34, however, indicates that the scanned object has the electromagnetic particles on its surface so pointing towards a PCB, a metal foil card or something else and pointing away from an authentic security document.

A detection apparatus according to the invention has following advantages. The detection apparatus is a low cost apparatus and a light weight apparatus. The apparatus is easy to install on e.g. a photocopying apparatus and requires no maintenance. Another advantage is that the same electronics and data processing techniques can be used to treat both the microwave and the infrared signals.

Still another advantage is based on the phenomenon of background infrared level: every document, whether or not it comprises stainless steel fibres or other electromagnetic particles, has a minimum level of infrared reflection above a zero level. This means that a covered infrared sensor head or a broken connection between the sensor head and the signal processing electronics, caused by accident or by falsifiers, can be easily detected. This advantage from the phenomenon of background infrared level may be combined with the phenomenon of background microwave level which is constituted by reflections of metal work in the neighborhood during the movement of the microwave sensor. Such a background microwave level is difficult to imitate and can also lead to detection of a broken or covered microwave sensor.

Figure 6:
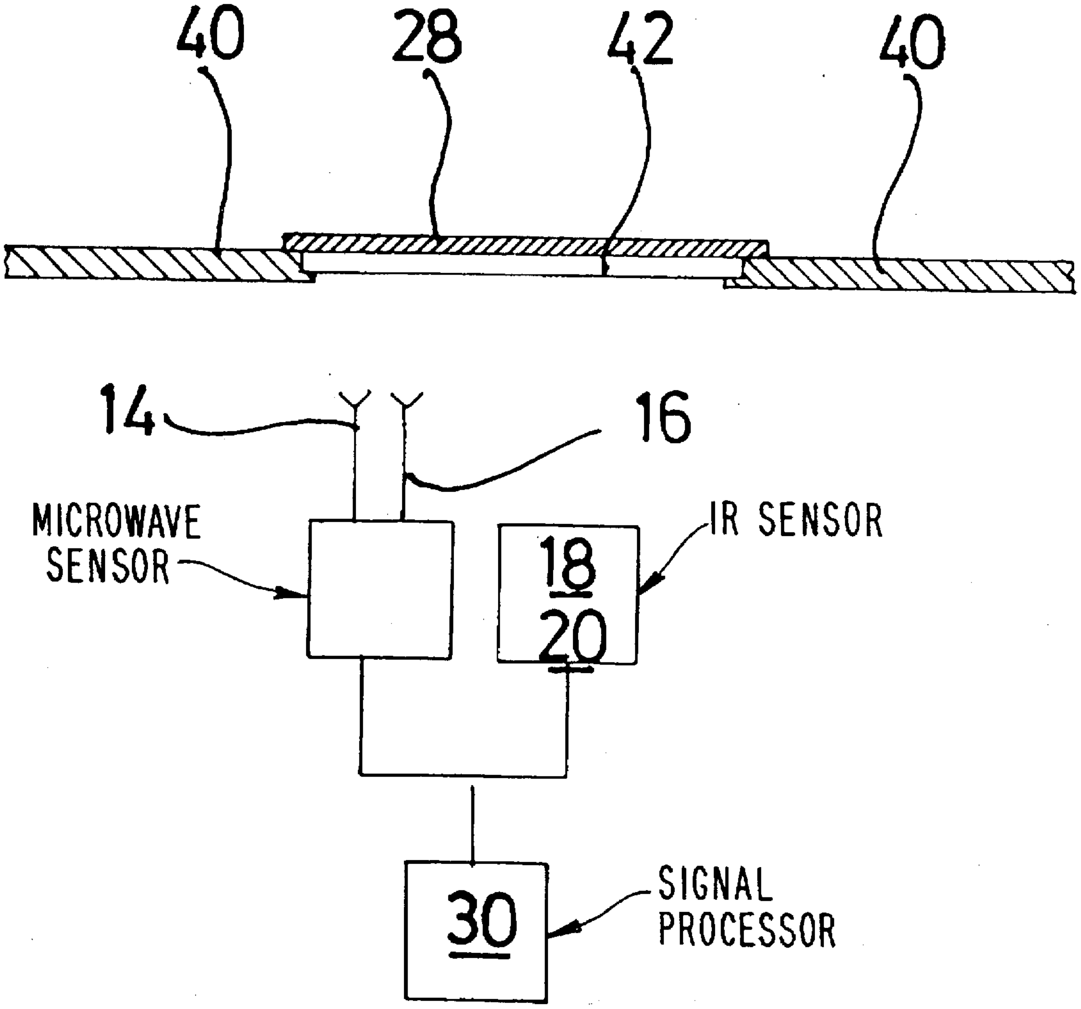
FIG. 6 illustrates the working of a second embodiment of an apparatus according to the invention.

A detection apparatus according to the present invention is not limited to an apparatus comprising a plurality of microwave sensors and infrared sensors. The present invention also relates to a detection apparatus with only one microwave sensor and only one infrared sensor. FIG. 6 illustrates such a detection apparatus.

This apparatus comprises one microwave emitter 14 and one microwave receiver 16 which form both the microwave sensor 14–16. The apparatus further comprises one infrared LED 18 and one photodiode 20. Means are provided to realize a relative movement between a document to be scanned, on the one hand, and the microwave sensor 14–16 and the infrared sensor 18–20, on the other hand.

The microwaves and the infrared waves are emitted towards a document 28 which lies on a glass 42 embedded in a frame 40. Any microwaves and infrared waves reflected or scattered back from document 28 are received by the microwave receiver 16 and the photodiode 20 and are brought together in a processor 30. Here again, highly variational microwave and infrared signals and a high correlation therebetween point towards PCB, metal foil cards and the like.

Such detection apparatus with only one microwave sensor and only one infrared sensor can be used in automatic vending machines, in automatic dispensing apparatus, in automatic bank note counting machines, etc. . . .

I claim:

1. A method of checking the authenticity of a security document, said method comprising the following steps:

a) providing a document comprising a base material;

b) providing particles having some electromagnetic properties differing substantially from the corresponding electromagnetic properties of said base material to said document;

c) emitting near infrared or visible waves to said document;

d) detecting any of said emitted near infrared or visible waves reflected from said document;

e) processing said detected near infrared or visible waves in order to differentiate a security document comprising said particles in its volume from a non-security document comprising said particles on its surface.

2. A method according to claim 1, said method further comprising the following steps:

emitting microwaves to said document;

detecting any of said emitted microwaves reflected from said document; and processing said detected microwaves.

3. A method according to claim 2, said method further comprising the following step:

comparing said detected near infrared or visible waves with said detected microwaves.

4. A method according to claim 1 wherein said method is applied in a reproduction apparatus.

5. A method according to claim 1 wherein said method is applied in an automatic counting machine.

6. A method according to claim 1 wherein said method is applied in an automatic vending machine.

7. A method of checking the type of a checkable article, said method comprising the following steps:

providing a checkable article comprising a base material and particles having at least one electromagnetic property differing substantially from a corresponding electromagnetic property of said base material, said checkable article comprising one of a first article having said particles located within said base material and a second article having said particles located on a surface of said base material;

directing electromagnetic waves having a wavelength within near infrared and visible wavelengths to said checkable article for reflection from said checkable article as reflected waves;

detecting said reflected waves as detected waves; and processing said detected waves to determine whether said checkable article is said first article or said second article.

8. The method of claim 7, wherein in said providing step said first article consists of a first type of document and said second article consists of a second type of document.

9. The method of claim 7, wherein in said providing step said first article consists of a security article and said second article consists of a non-security article.

10. The method of claim 9, wherein in said providing step said security article consists of a security document and said non-security article consists of a non-security document.

11. The method of claim 7, wherein in said detecting step said detected waves have a first characteristic when said checkable article comprises said first article and a second characteristic when said checkable article comprises said second article; and said processing step determines whether said first characteristic or said second characteristic is present in said detected waves.

12. The method of claim 11, further comprising the following steps:

permitting accurate reproduction of said checkable article when said processing step determines said second characteristic is present; and not permitting accurate reproduction of said checkable article when said processing step determines said first characteristic is present.

13. The method of claim 11, further comprising the following steps:

including said checkable article in a count when said processing step determines said first characteristic is present; and excluding said checkable article from said count when said processing step determines said second characteristics is present.

14. The method of claim 11, further comprising the following steps:

accepting said checkable article when said processing step determines said first characteristic is present; and rejecting said checkable article when said processing step determines said second characteristic is present.

15. The method of claim 11, wherein in said detecting step said first characteristic has a different shape and magnitude than said second characteristic.

16. The method of claim 11, wherein in said detecting step said first characteristic has a relatively flat and low response and said second characteristic has a relatively spiky and high response.

17. The method of claim 7 wherein, in said detecting step said detected waves have one of a first characteristic and a second characteristic;

said method further comprising the steps of:

directing microwaves to said checkable article for reflection from said checkable article as reflected microwaves, and detecting said reflected microwaves as detected microwaves; and said processing step further comprising processing said detected microwaves to determine whether said detected microwaves have a low degree of correlation with said first characteristic or a high degree of correlation with said second characteristic;

said low degree of correlation determining said checkable article is said first article and said high degree of correlation determining said checkable article is said second article.

* * * * *